United States Patent [19]

Kimura et al.

[11] Patent Number: 5,762,816
[45] Date of Patent: Jun. 9, 1998

[54] PIEZOELECTRIC CERAMIC COMPOSITION

[75] Inventors: Masahiko Kimura, Shiga-ken; Akira Ando, Oumihachiman; Hiroshi Takagi, Otsu, all of Japan

[73] Assignee: Murata Manufacturing Co., Ltd., Kyoto, Japan

[21] Appl. No.: 748,383

[22] Filed: Nov. 13, 1996

[30] Foreign Application Priority Data

Nov. 14, 1995 [JP] Japan .................................. 7-295636
Feb. 16, 1996 [JP] Japan .................................. 8-029357

[51] Int. Cl.$^6$ .................................. C04B 35/497
[52] U.S. Cl. .................................. 252/62.9 R; 501/134; 423/595
[58] Field of Search .................. 252/62.9 R; 501/134; 423/595

[56] References Cited

U.S. PATENT DOCUMENTS 3,222,283  12/1965  Illyn et al. .................. 252/62.9 R

FOREIGN PATENT DOCUMENTS 1203078  1/1985  U.S.S.R. ...................... 252/62.9 R

*Primary Examiner*—Melissa Bonner
*Attorney, Agent, or Firm*—Ostrolenk, Faber, Gerb & Soffen, LLP

[57] ABSTRACT

The present invention provides a lead niobate piezoelectric ceramic composition useful for a piezoelectric ceramic element employable at a high temperature, such as a piezoelectric ceramic sensor, which is burned in air and which has a Curie temperature of over 400° C. The piezoelectric ceramic composition contains as a main component a ceramic composition having a tungsten bronze type crystal structure and represented by the formula

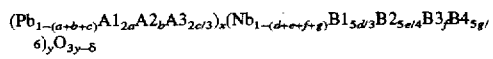

$$(Pb_{1-(a+b+c)}A1_{2a}A2_{b}A3_{2c/3})_x(Nb_{1-(d+e+f+g)}B1_{5d/3}B2_{5e/4}B3_fB4_{5g/6})_yO_{3y-\delta}$$

wherein A1 indicates a monovalent metallic element, A2 indicates a divalent metallic element, A3 and B1 each indicate a trivalent metallic element, B2 indicates a tetravalent metallic element, B3 indicates a pentavalent metallic element, B4 indicates a hexavalent metallic element, $\delta$ indicates a defect amount, and a, b, c, d, e, f, g, x and y satisfy the following relations:

each of a through $g \geq 0$,
$0.015 < a+b+c < 0.225$,
$0 < d+e+f+g < 0.2$,
$0 < x$, $0 < y$, and
$x/y < \frac{1}{2}$.

16 Claims, No Drawings

PIEZOELECTRIC CERAMIC COMPOSITION

BACKGROUND OF THE INVENTION

1. Field of the Invention

The present invention relates to a piezoelectric ceramic composition useful as a material for a piezoelectric ceramic element, particularly a piezoelectric ceramic sensor.

2. Description of the Related Art

A piezoelectric ceramic composition comprising lead titanate zirconate ($Pb(Ti_xZr_{1-x})O_3$) as a main component is conventionally widely use as a piezoelectric ceramic composition for a piezoelectric ceramic element such as a piezoelectric ceramic sensor. However, piezoelectric ceramic compositions comprising lead titanate zirconate as a main component generally have a Curie temperature of 200° to 400° C., and thus have the problem that the piezoelectricity disappears within a temperature range over the Curie temperature, and the composition cannot be used for a piezoelectric ceramic element such as a piezoelectric ceramic sensor.

On the other hand, a composition comprising lead niobate ($PbNb_2O_8$) is known as a piezoelectric ceramic composition having a Curie temperature in excess of 400° C. and particularly having a Curie temperature of about 570° C. However, this piezoelectric ceramic composition comprising lead niobate as a main component generally has poor sinterability. For example, $PbNb_2O_6$ cannot be easily burned to obtain a sintered product which can be polarized in the ambient air, and a special sintering method such as a hot press method must be used for sintering.

In regard to this problem, it has been known that when the Pb in the piezoelectric ceramic composition is partly replaced by Ca, Ba or the like for improving sinterability, a good sintered product can be obtained by burning in the atmosphere. However, when Pb is partly replaced by Ca, Ba or the like, as just described, there arises the problem that the Curie temperature is significantly decreased. For example, although a polarizable sintered product can be obtained by burning in the atmosphere when about 30 mol % of Pb is replaced by Ca, the Curie temperature of the resultant piezoelectric sintered product is decreased to 400° C. or lower.

SUMMARY OF THE INVENTION

Accordingly, an object of the present invention is to provide a piezoelectric ceramic composition which has a Curie temperature of over 400° C. even if burned in the atmosphere, and which is useful as a piezoelectric ceramic element employed under a high temperature conditions, such as a piezoelectric ceramic sensor.

In order to achieve this object, in accordance with an embodiment of the present invention, there is provided a piezoelectric ceramic composition comprising as a main component, a ceramic composition having a tungsten bronze type crystal structure and represented by the formula ($Pb_{1-(a+b+c)}Al_{2a}A2_bA3_{2c/3})xNb_yO_{3y-\delta}$ wherein A1 indicates a monovalent metallic element, A2 indicates a divalent metallic element, δ is a defect amount, A3 indicates a trivalent metallic element, and a, b, c, x and y satisfy the following relations:

$0 \leq a$, $0 \leq b$, $0 \leq c$, $0.015 < a+b+c < 0.225$, $0 < x$, $0 < y$, $x/y < \frac{1}{2}$ In the piezoelectric ceramic composition, A1 is preferably at least one of Li, Na, K and Rb; A2 is preferably at least one of Ca, Sr, Ba, Cd and Sn; and A3 is preferably at least one of Y, La, Nd, Pm, Sm, Eu, Gd, Tb, Dy and Bi.

The term "defect amount" is used in its conventional sense to refer to an adjustment for correcting the net valency of the ceramic.

In accordance with another embodiment of the present invention, there is provided a piezoelectric ceramic composition comprising as a main component a ceramic composition having a tungsten bronze type crystal structure and represented by the formula

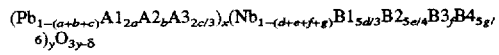

wherein A1 indicates a monovalent metallic element, A2 indicates a divalent metallic element, A3 and B1 each indicate a trivalent metallic element, B2 indicates a tetravalent metallic element, B3 indicates a pentavalent metallic element, B4 indicates a hexavalent metallic element, δ is a defect amount and a, b, c, d, e, f, g, x and y satisfy the following relations:

$0 \leq a$, $0 \leq b$, $0 \leq c$, $0 \leq d$, $0 \leq e$, $0 \leq f$, $0 \leq g$, $0.015 < a+b+c < 0.225$, $0 < d+e+f+g \leq 0.2$, $0 < x$, $0 < y$, $x/y < \frac{1}{2}$ In the piezoelectric ceramic composition, A1 is preferably at least one of Li, Na, K and Rb; A2 is preferably at least one of Ca, Sr, Ba, Cd and Sn; A3 is preferably at least one of Y, La, Nd, Pm, Sm, Eu, Gd, Tb, Dy and Bi; B1 is preferably Sb; B2 is preferably at least one of Ti and Zr; B3 is preferably Ta; and B4 is preferably W.

The piezoelectric ceramic composition further comprises as a sub-component relative to the main component, at least one oxide of Mn, Cr, Si, W, Ni, Co, Sn, Mg, Sb and Fe in a total amount of up to about 5.0 wt % in terms of $MnO_2$, $Cr_2O_3$, $SiO_2$, $WO_3$, $NiO$, $Co_2O_3$, $SnO_2$, $MgO$, $Sb_2O_3$ and $Fe_2O_3$, respectively.

DESCRIPTION OF THE REFERRED EMBODIMENT

A piezoelectric ceramic composition is described with reference to an embodiment of the present invention.

$Pb_3O_4$, $Li_2CO_3$, $CaCO_3$, $SrCO_3$, $BaCO_3$, $La_2O_3$, $Y_2O_3$, $Nb_2O_5$, $Ta_2O_5$, $Sb_2O_3$, $ZrO_2$, $WO_3$, $MnCO_3$, $Cr_2O_3$, $NiO$ and $Co_2O_3$ were prepared as starting raw materials.

There raw materials were the weighed to obtain each of the compositions shown in Table 1 represented by the formula

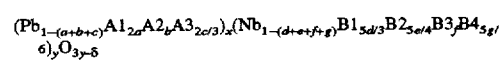

wherein A1 indicates a monovalent metallic element, A2 indicates a divalent metallic element, A3 and B1 each indicate a trivalent metallic element, B2 indicates a tetravalent metallic element, B3 indicates a pentavalent metallic element, B4 indicates a hexavalent metallic element.

The raw materials for A1, A2, A3, B1, B2, B3 and B4 in the formula were $Li_2CO_3$; $CaCO_3$, $SrCO_3$ and $BaCO_3$; $La_2O_3$ and $Y_2O_3$; $Sb_2O_3$; $ZrO_2$; $Ta_2O_5$; and $WO_3$; respectively.

TABLE 1

| Sample No. | Formula | Sub-Component | Sub-Component (Wt. %) |
|---|---|---|---|
| *1 | $(Pb_{0.94}La_{0.94})Nb_2O_6$ | $MnO_2$ | 0.5 |
| *2 | $(Pb_{0.70}La_{0.20})Nb_2O_6$ | $MnO_2$ | 0.5 |
| *3 | $Pb_{0.99}Nb_2O_6$ | $MnO_2$ | 0.5 |
| 4 | $(Pb_{0.985}La_{0.10})_{0.99}Nb_2O_6$ | $MnO_2$ | 0.5 |
| 5 | $(Pb_{0.94}La_{0.04})_{0.99}Nb_2O_6$ | $MnO_2$ | 0.5 |
| 6 | $(Pb_{0.775}La_{0.150})_{0.99}Nb_2O_6$ | $MnO_2$ | 0.5 |
| *7 | $(Pb_{0.70}La_{0.20})_{0.99}Nb_2O_6$ | $MnO_2$ | 0.5 |
| 8 | $(Pb_{0.94}La_{0.04})_{0.96}Nb_2O_6$ | $MnO_2$ | 0.5 |
| 9 | $(Pb_{0.94}La_{0.04})_{0.97}Nb_2O_6$ | $MnO_2$ | 0.5 |
| 10 | $(Pb_{0.94}La_{0.04})_{0.99}Nb_2O_6$ | None | 0.0 |
| 11 | $(Pb_{0.94}La_{0.04})_{0.99}Nb_2O_6$ | $MnO_2$ | 1.0 |
| 12 | $(Pb_{0.94}La_{0.04})_{0.99}Nb_2O_6$ | $MnO_2$ | 5.0 |
| *13 | $(Pb_{0.94}La_{0.04})_{0.99}Nb_2O_6$ | $MnO_2$ | 6.0 |
| 14 | $(Pb_{0.94}La_{0.04})_{0.99}Nb_2O_6$ | $Cr_2O_3$ | 0.5 |
| 15 | $(Pb_{0.94}La_{0.04})_{0.99}Nb_2O_6$ | NiO | 0.5 |
| 16 | $(Pb_{0.94}La_{0.04})_{0.99}Nb_2O_6$ | $CO_2O_3$ | 0.5 |
| 17 | $(Pb_{0.94}Li_{0.12})_{0.99}Nb_2O_6$ | $MnO_2$ | 0.5 |
| 18 | $(Pb_{0.94}Ca_{0.06})_{0.99}Nb_2O_6$ | $MnO_2$ | 0.5 |
| 19 | $(Pb_{0.94}Sr_{0.06})_{0.99}Nb_2O_6$ | $MnO_2$ | 0.5 |
| 20 | $(Pb_{0.94}Ba_{0.06})_{0.99}Nb_2O_6$ | $MnO_2$ | 0.5 |
| 21 | $(Pb_{0.94}Y_{0.04})_{0.99}Nb_2O_6$ | $MnO_2$ | 0.5 |
| 22 | $(Pb_{0.94}Li_{0.01}Ca_{0.01}La_{0.09})_{0.99}Nb_2O_6$ | $MnO_2$ | 0.5 |
| 23 | $(Pb_{0.94}La_{0.04})_{0.99}(Nb_{0.95}Ta_{0.05})_2O_6$ | $MnO_2$ | 0.5 |
| 24 | $(Pb_{0.94}La_{0.04})_{0.99}(Nb_{0.80}Ta_{0.20})_2O_6$ | $MnO_2$ | 0.5 |
| *25 | $(Pb_{0.94}La_{0.04})_{0.99}(Nb_{0.70}Ta_{0.30})_2O_6$ | $MnO_2$ | 0.5 |
| 26 | $(Pb_{0.94}La_{0.04})_{0.99}(Nb_{0.97}Sb_{0.05})_2O_6$ | $MnO_2$ | 0.5 |
| 27 | $(Pb_{0.94}La_{0.04})_{0.99}(Nb_{0.96}Zr_{0.05})_2O_6$ | $MnO_2$ | 0.5 |
| 28 | $(Pb_{0.94}La_{0.04})_{0.99}(Nb_{0.94}Y_{0.05})_2O_6$ | $MnO_2$ | 0.5 |

TABLE 2

| Sample No. | Density (g/cm$^3$) | Curie Temperature °C. | Kt (%) | $d_{33}$ (pC/N) |
|---|---|---|---|---|
| *1 | 4.2 | Impossible to Polarize | | |
| *2 | 5.8 | 380 | 30 | 80 |
| *3 | 4.5 | Impossible to Polarize | | |
| 4 | 5.5 | 545 | 28 | 80 |
| 5 | 6.2 | 515 | 37 | 95 |
| 6 | 6.3 | 405 | 30 | 80 |
| *7 | 6.2 | 380 | 27 | 75 |
| 8 | 6.2 | 515 | 28 | 88 |
| 9 | 6.2 | 515 | 25 | 80 |
| 10 | 5.8 | 520 | 25 | 80 |
| 11 | 6.2 | 515 | 27 | 85 |
| 12 | 5.5 | 500 | 23 | 75 |
| *13 | 5.1 | Impossible to Polarize | | |
| 14 | 6.0 | 515 | 32 | 90 |
| 15 | 6.0 | 515 | 32 | 90 |
| 16 | 6.2 | 515 | 35 | 90 |
| 17 | 5.8 | 520 | 25 | 80 |
| 18 | 5.8 | 500 | 30 | 80 |
| 19 | 6.0 | 480 | 28 | 75 |
| 20 | 5.8 | 500 | 30 | 80 |
| 21 | 6.2 | 510 | 30 | 85 |
| 22 | 6.2 | 500 | 33 | 90 |
| 23 | 6.2 | 480 | 25 | 75 |
| 24 | 6.2 | 410 | 20 | 70 |
| *25 | 6.2 | 280 | 20 | 70 |
| 26 | 6.2 | 480 | 25 | 75 |
| 27 | 6.2 | 480 | 25 | 75 |
| 28 | 6.2 | 480 | 25 | 75 |

A solvent such as water, isopropyl alcohol or the like was added to a mixture of the weighed raw materials, followed by wet mixing using a ball mill for about 4 hours. The resultant wet mixture was then dried, pre-burned at 700° to 900° C. and coarsely ground.

An organic binder was then added to the thus-obtained pre-burned ground mixture, followed by wet-mixing and grinding using a ball mill for 4 hours. After the mixture was the passed through a 40-mesh sieve in order to adjust the particle size, the mixture was molded into a disk having a diameter of 12 mm and a thickness of 1.2 mm under a pressure of 1000 kg/cm$^2$. The disk was then burned at a temperature of 1250° to 1300° C. in air to obtain a ceramic in the form of a ceramic disk.

A silver paste was then coated on both main surfaces of the ceramic disk and burned to form silver electrodes, followed by polarization in insulating oil at 100° to 200° C. under application of a DC voltage of 5 to 10 kV/mm for 10 to 30 minutes, to obtain a piezoelectric ceramic disk sample.

The thus-obtained sample was measured with respect to the density (ρ), the Curie temperature ($T_c$), the electromechanical coupling factor ($K_t$) in vibration in the thickness direction, and the piezoelectric constant ($d_{33}$). The results of measurement are shown in Table 2. In Table 2, samples marked with an asterisk are outside of the range of the present invention, and the other samples are within the range of the present invention. $K_t$ was determined by calculation using the resonance and antiresonance frequencies measured by an impedance measuring device, and $d_{33}$ was determined by calculation using the measured charge amount generated by applying stress.

Table 2 reveals that each of the samples within the range of the present invention has a density of about 5.5 to 6.3 g/cm$^3$, and is a sintered product which can be used as a piezoelectric ceramic element. The resultant piezoelectric ceramic has a Curie temperature of over 400° C., $K_t$ within the range of about 20 to 37%, and $d_{33}$ within the range of about 70 to 95 pC/N.

Of the samples having the formula $(Pb_{1-(a+b+c)}Al_{2a}A2_bA3_{2c/3})_x(Nb_{1-(d+e+f+g)}B1_{5d/3}B2_{5e/4}B3_fB4_{5g/6})_yO_{3y-\delta}$ wherein Al indicates a monovalent metallic element, A2 indicates a divalent metallic element, A3 and B1 each indicate a trivalent metallic element, B2 indicates a tetravalent metallic element, B3 indicates a pentavalent metallic element, B4 indicates a hexavalent metallic element, the samples out of the range of the present invention show the poor characteristics noted below, and a high-temperature piezoelectric ceramic having a Curie temperature over 400° C., which is the object of the present invention, cannot be obtained.

Namely, when the relation between the amount x of $(Pb_{1-(a+b+c)}Al_{2a}A2_bA3_{2c/3})$ and the amount y of $(Nb_{1-(d+e+f+g)}B1_{5d/3}B2_{5e/4}B3_fB4_{5g/6})$, i.e., x/y, is ≧½, the ceramic has a low density due to insufficient sintering, and cannot be polarized, as shown by Sample No. 1.

When the value of (a+b+c) is less than about 0.015, i.e., when the Pb amount (1−(a+b+c)) exceeds about 0.985, the ceramic has a low density due to insufficient sintering, and cannot be polarized, as shown by Sample No. 3. On the other hand, when the value of (a+b+c) exceeds about 0.225, i.e., when the Pb amount (1−(a+b+c)) is less than 0.775, the Curie temperature is lower than 400° C., as shown by Sample No. 7.

When the value of (d+e+f+g) exceeds about 0.2, i.e., when the Nb amount (1−(d+e+f+g)) is less than 0.8, the Curie temperature is lower than 400° C., as shown by Sample No. 25.

When the relation between the amount x of $(Pb_{1-(a+b+c)}Al_{2a}A2_bA3_{2c/3})$ and the amount y of $(Nb_{1-(d+e+f+g)}B1_{5d/}$ $_3B2_{5e/4}B3_fB4_{5g/6})$, i.e., x/y. is≧½, and when the Pb amount (1−(a+b+c)) is less than about 0.775, the Curie temperature is lower than 400° C., as shown by Sample No. 2.

When the amount of the sub-component added exceeds about 5.0% by weight, the ceramic has a low density due to insufficient sintering, and cannot be polarized.

The piezoelectric ceramic composition of the present invention is not limited to the above embodiment. Namely, in the formula $(Pb_{1-(a+b+c)}A1_{2a}A2_bA3_{2c/3})xNb_yO_{3y-\delta}$ or $(Pb_{1-(a+b+c)}A1_{2a}A2_bA3_{2c/3})_x(Nb_{1-(d+e+f+g)}B1_{5d/3}B2_{5e/4}B3_fB4_{5g/6})_yO_{3y-\delta}$, one or more of Li, Na, K and Rb may be used as monovalent metallic element; one or more of Ca, Sr, Ba, Cd and Sn may be used as divalent metallic element A2; one or more of Y, La, Nd, Pm, Sm, Eu, Gd, Tb, Dy and Bi may be used as trivalent metallic element A3; a trivalent metallic element other than Sb may be appropriately used as trivalent metallic element B1; one or both of Ti and Zr may be used as tetravalent metallic element B2; a pentavalent element other than Ta may be appropriately used as pentavalent metallic element B3; and a hexavalent element other than W may be appropriately used as hexavalent metallic element B4.

One or more oxides of Mn, Cr, Sr, W, Ni, Co, Sn, Mg, Sb and Fe may be used as the sub-component.

In preferred embodiments, as shown above, each of a and b are up to about 0.06, c is up to about 0.25, x is about 0.97–0.99, y is 2, δ is 0, each of d through g are up to about 0.6, (d+e+f+g) is about 0.03–0.2, x/y is about 0.485–0.495, A1 is Li, A2 is Ca, Sr and/or Ba, A3 is La or Y, B1 is Sb, B2 is Zr, B3 is La, B4 is W, and the subcomponent is an oxide of Mn, Cr, Ni or Co.

As described above, the present invention can provide a lead niobate piezoelectric ceramic composition useful for a piezoelectric ceramic element used at a high temperature, such as a piezoelectric ceramic sensor, which is burned in air and which has a Curie temperature of over 400° C.

What is claimed is:

1. A polarizable piezoelectric ceramic composition comprising as a main component a ceramic composition having a tungsten bronze crystal structure and represented by the formula $$(Pb_{1-(a+b+c)}A1_{2a}A2_bA3_{2c/3})xNB_yO_{3y-\delta}$$

wherein A1 is at least one monovalent metallic element, A2 is at least one divalent metallic element selected from the group consisting of Ca, Sr, Cd and Sn, A3 is at least one trivalent metallic element, δ is a defect amount, 0≦a, 0≦b, 0≦c, 0.015<a+b+c<0.225, 0<x, 0<y and x/y<½.

2. A polarizable piezoelectric ceramic composition according to claim 1, wherein A1 is at least one member of the group consisting of Li, Na, K and Rb; and A3 is at least one member of the group consisting of Y, La, Nd, Pm, Sm, Eu, Gd, Tb, Dy and Bi.

3. A polarizable piezoelectric ceramic composition according to claim 2, further comprising as a sub-component at least one oxide of Mn, Cr, Si, W, Ni, Co, Sn, Mg, Sb and Fe in a total amount of up to about 5.0 wt % calculated as $MnO_2$, $Cr_2O_3$, $SiO_2$, $WO_3$, NiO, $Co_2O_3$, $SnO_2$, MgO, $Sb_2O_3$ and $Fe_2O_3$, respectively.

4. A polarizable piezoelectric ceramic composition comprising as a main component a ceramic composition having a tungsten bronze crystal structure and represented by the formula $$(Pb_{1-(a+b+c)}A1_{2a}A2_bA3_{2c/3})xNB_yO_{3y-\delta}$$

wherein A1 is Li; A2 is at least one member of the group consisting of Ca, Sr and Ba; A3 is Y or La; x is about 0.97–0.99; y is 2; δ is 0; 0.015<a+b+c<0.225; each of a and b is greater than 0 up to about 0.06; c is from 0 up to about 0.25; x/y is about 0.485–0.495; and further comprising as a sub-component at least one oxide of Mn, Cr, Ni, and Co, in a total amount of up to about 5.0 wt % calculated as $MnO_2$, $Cr_2O_3$, NiO and $Co_2O_3$, respectively.

5. A polarized piezoelectric ceramic composition comprising as a main component a ceramic composition having a tungsten bronze crystal structure and represented by the formula $$(Pb_{1-(a+b+c)}A1_{2a}A2_bA3_{2c/3})xNB_yO_{3y-\delta}$$

wherein A1 is at least one monovalent metallic element, A2 is at least one divalent metallic element selected from the group consisting of Ca, Sr, Cd and Sn, A3 is at least one trivalent metallic element, δ is a defect amount, 0≦a, 0≦b, 0≦c, 0.015<a+b+c<0.225, 0<x, 0<y and x/y<½.

6. A polarized piezoelectric ceramic composition according to claim 5, wherein A1 is at least one member of the group consisting of Li, Na, K and Rb; and A3 is at least one member of the group consisting of Y, La, Nd, Pm, Sm, Eu, Gd, Tb, Dy and Bi.

7. A polarized piezoelectric ceramic composition according to claim 6, further comprising as a sub-component at least one oxide of Mn, Cr, Si, W, Ni, Co, Sn, Mg, Sb and Fe in a total amount of up to about 5.0 wt % calculated as $MnO_2$, $Cr_2O_3$, $SiO_2$, $WO_3$, NiO, $Co_2O_3$, $SnO_2$, MgO, $Sb_2O_3$ and $Fe_2O_3$, respectively.

8. A polarized piezoelectric ceramic composition comprising as a main component a ceramic composition having a tungsten bronze crystal structure and represented by the formula $$(Pb_{1-(a+b+c)}A1_{2a}A2_bA3_{2c/3})xNB_yO_{3y-\delta}$$

wherein A1 is Li; A2 is at least one member of the group consisting of Ca, Sr and Ba; A3 is Y or La; 0.015<a+b+c<0.225; x is about 0.97–0.99; y is 2; δ is 0; each of a and b is greater than 0 up to about 0.06; c is from 0 up to about 0.25; x/y is about 0.485–0.495; and further comprising as a sub-component at least one oxide of Mn, Cr, Ni, and Co, in a total amount of up to about 5.0 wt % calculated as $MnO_2$, $Cr_2O_3$, NiO and $Co_2O_3$, respectively.

9. A polarizable piezoelectric ceramic composition comprising as a main component a ceramic composition having a tungsten bronze crystal structure and represented by the formula $$(Pb_{1-(a+b+c)}A1_{2a}A2_bA3_{2c/3})_x(Nb_{1-(d+e+f+g)}B1_{5d/3}B2_{5e/4}B3_fB4_{5g/6})_yO_{3y-\delta}$$

wherein A1 is at least one monovalent metallic element, A2 is at least one divalent metallic element, A3 and B1 each are at least one trivalent metallic element, B2 is a tetravalent metallic element, B3 is at least one pentavalent metallic element, B4 is at least one hexavalent metallic element, δ is a defect amount, 0≦a, 0≦b, 0≦c, 0≦d, 0≦e, 0≦f, 0≦g, 0.015<a+b+c<0.225, 0<d+e+f+g<0.2, 0<x, 0<y and x/y<½.

10. A polarizable piezoelectric ceramic composition according to claim 9, wherein A1 is at least one member of the group consisting of Li, Na, K and Rb; A2 is at least one member of the group consisting of Ca, Sr, Ba, Cd and Sn; A3 is at least one member of the group consisting of Y, La, Nd, Pm, Sm, Eu, Gd, Tb, Dy and Bi; B1 is Sb; B2 is at least one member of the group consisting of Ti and Zr; B3 is Ta; and B4 is W.

11. A polarizable piezoelectric ceramic composition according to claim 10, further comprising as a sub-component at least one oxide of Mn, Cr, Si, W, Ni, Co, Sn, Mg, Sb and Fe in a total amount of up to about 5.0 wt % calculated as $MnO_2$, $Cr_2O_3$, $SiO_2$, $WO_3$, NiO, $Co_2O_3$, $SnO_2$, MgO, $Sb_2O_3$ and $Fe_2O_3$, respectively.

12. A polarizable piezoelectric ceramic composition according to claim 10, wherein A1 is Li; A2 is at least one member of the group consisting of Ca, Sr and Ba; A3 is Y or La; B1 is Sb; B2 is Zr; B3 is Ta; B4 is W; x is about 0.97–0.99; y is 2; δ is 0; each of a and b is up to about 0.06; c is up to about 0.25; each of d through g are up to about 0.6; (d+e+f+g) is about 0.03–0.2; x/y is about 0.485–0.495; and further comprising as a sub-component at least one oxide of Mn, Cr, Ni, and Co, in a total amount of up to about 5.0 wt % calculated as $MnO_2$, $Cr_2O_3$, NiO and $Co_2O_3$, respectively.

13. A polarized piezoelectric ceramic composition comprising as a main component a ceramic composition having a tungsten bronze crystal structure and represented by the formula

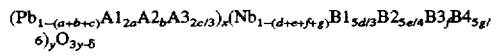

$(Pb_{1-(a+b+c)}A1_{2a}A2_{b}A3_{2c/3})_x(Nb_{1-(d+e+f+g)}B1_{5d/3}B2_{5e/4}B3_fB4_{5g/6})_yO_{3y-\delta}$ wherein A1 is at least one monovalent metallic element, A2 is at least one divalent metallic element, A3 and B1 each are at least one trivalent metallic element, B2 is at least one tetravalent metallic element, B3 is at least one pentavalent metallic element, B4 is a hexavalent metallic element, δ is a defect amount, $0 \leq a$, $0 \leq b$, $0 \leq c$, $0 \leq d$, $0 \leq e$, $0 \leq f$, $0 \leq g$, $0.015 < a+b+c < 0.225$, $0 < d+e+f+g < 0.2$, $0 < x$, $0 < y$ and $x/y < \frac{1}{2}$.

14. A polarized piezoelectric ceramic composition according to claim 13, wherein A1 is at least one member of the group consisting of Li, Na, K and Rb; A2 is at least one member of the group consisting of Ca, Sr, Ba, Cd and Sn; A3 is at least one member of the group consisting of Y, La, Nd, Pm, Sm, Eu, Gd, Tb, Dy and Bi; B1 is Sb; B2 is at least one member of the group consisting of Ti and Zr; B3 is Ta; and B4 is W.

15. A polarized piezoelectric ceramic composition according to claim 13, further comprising as a sub-component at least one oxide of Mn, Cr, Si, W, Ni, Co, Sn, Mg, Sb and Fe in a total amount of up to about 5.0 wt % calculated as $MnO_2$, $Cr_2O_3$, $SiO_2$, $WO_3$, NiO, $Co_2O_3$, $SnO_2$, MgO, $Sb_2O_3$ and $Fe_2O_3$, respectively.

16. A polarized piezoelectric ceramic composition according to claim 13, wherein A1 is Li; A2 is at least one member of the group consisting of Ca, Sr and Ba; A3 is Y or La; B1 is Sb; B2 is Zr; B3 is Ta; B4 is W; x is about 0.97–0.99; y is 2; δ is 0; each of a and b is up to about 0.06; c is up to about 0.25; each of d through g are up to about 0.6; (d+e+f+g) is about 0.03–0.2; x/y is about 0.485–0.495; and further comprising as a sub-component at least one oxide of Mn, Cr, Ni, and Co, in a total amount of up to about 5.0 wt % calculated as $MnO_2$, $Cr_2O_3$, NiO and $Co_2O_3$, respectively.

* * * * *